(12) United States Patent
Schaller et al.

(10) Patent No.: US 12,170,220 B2
(45) Date of Patent: Dec. 17, 2024

(54) ROBOT FOR SIMULTANEOUS SUBSTRATE TRANSFER

(71) Applicant: Applied Materials, Inc., Santa Clara, CA (US)

(72) Inventors: Jason M. Schaller, Austin, TX (US); Luke Bonecutter, Cedar Park, TX (US); Charles T. Carlson, Austin, TX (US); Rajkumar Thanu, Santa Clara, CA (US); Karuppasamy Muthukamatchi, Bangalore (IN); Jeff Hudgens, San Francisco, CA (US); Benjamin Riordon, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 244 days.

(21) Appl. No.: 17/940,369

(22) Filed: Sep. 8, 2022

(65) Prior Publication Data
US 2023/0005783 A1 Jan. 5, 2023

Related U.S. Application Data

(63) Continuation of application No. 16/922,727, filed on Jul. 7, 2020, now Pat. No. 11,443,973.
(Continued)

(51) Int. Cl.
*H01L 21/67* (2006.01)
*B65G 47/90* (2006.01)
*H01L 21/687* (2006.01)

(52) U.S. Cl.
CPC ........ *H01L 21/68707* (2013.01); *B65G 47/90* (2013.01); *H01L 21/67196* (2013.01)

(58) Field of Classification Search
CPC ...................................................... H01L 21/67
See application file for complete search history.

(56) References Cited

U.S. PATENT DOCUMENTS

| 5,513,948 A | 5/1996 | Bacchi et al. |
| 5,667,592 A | 9/1997 | Boitnott et al. |

(Continued)

FOREIGN PATENT DOCUMENTS

| CN | 1909182 A | 2/2007 |
| CN | 101835922 A | 9/2010 |

(Continued)

OTHER PUBLICATIONS

Application No. PCT/US2020/040994, International Preliminary Report on Patentability, Mailed On Jan. 27, 2022, 9 pages.
(Continued)

*Primary Examiner* — Ronald P Jarrett
(74) *Attorney, Agent, or Firm* — Kilpatrick Townsend & Stockton LLP

(57) ABSTRACT

Exemplary substrate processing systems may include a transfer region housing defining a transfer region fluidly coupled with a plurality of processing regions. A sidewall of the transfer region housing may define a sealable access for providing and receiving substrates. The systems may include a plurality of substrate supports disposed within the transfer region. The systems may also include a transfer apparatus having a central hub including a first shaft and a second shaft counter-rotatable with the first shaft. The transfer apparatus may include an eccentric hub extending at least partially through the central hub, and which is radially offset from a central axis of the central hub. The transfer apparatus may also include an end effector coupled with the eccentric hub. The end effector may include a plurality of
(Continued)

arms having a number of arms equal to the number of substrate supports of the plurality of substrate supports.

20 Claims, 12 Drawing Sheets

Related U.S. Application Data

(60) Provisional application No. 62/873,458, filed on Jul. 12, 2019.

(56) References Cited

U.S. PATENT DOCUMENTS

| | | |
|---|---|---|
| 5,765,444 A | 6/1998 | Bacchi et al. |
| 5,855,465 A | 1/1999 | Boitnott et al. |
| 6,156,124 A | 12/2000 | Tobin |
| 6,293,746 B1 | 9/2001 | Ogawa et al. |
| 6,435,428 B2 | 8/2002 | Kim et al. |
| 6,635,115 B1 | 10/2003 | Fairbairn et al. |
| 6,827,815 B2 | 12/2004 | Hytros et al. |
| 6,962,644 B2 | 11/2005 | Paterson et al. |
| 7,516,833 B2 | 4/2009 | Todaka |
| 8,033,769 B2 | 10/2011 | Gage et al. |
| 8,336,488 B2 | 12/2012 | Chen et al. |
| 9,184,072 B2 | 11/2015 | Devine et al. |
| 9,299,598 B2 | 3/2016 | Blank |
| 9,449,795 B2 | 9/2016 | Sabri et al. |
| 9,484,233 B2 | 11/2016 | Leeser |
| 9,842,757 B2 | 12/2017 | Hosek et al. |
| 10,109,517 B1 | 10/2018 | Blank et al. |
| 10,128,134 B2 | 11/2018 | Kondoh |
| 10,224,182 B2 | 3/2019 | Keil et al. |
| 10,347,515 B2 | 7/2019 | Heinz |
| 10,363,665 B2 | 7/2019 | Hosek et al. |
| 11,117,265 B2 | 9/2021 | Wirth et al. |
| 11,355,367 B2 | 6/2022 | Schaller et al. |
| 11,443,973 B2 | 9/2022 | Schaller et al. |
| 11,476,135 B2 | 10/2022 | Carlson et al. |
| 11,515,676 B2 | 11/2022 | Mishra et al. |
| 11,574,826 B2 | 2/2023 | Schaller et al. |
| 11,590,662 B2 | 2/2023 | Wirth et al. |
| 11,626,303 B2 | 4/2023 | Kalsekar |
| 11,670,492 B2 | 6/2023 | Wu et al. |
| 2002/0071756 A1 | 6/2002 | Gonzalez |
| 2003/0003848 A1 | 1/2003 | Tobin |
| 2003/0082042 A1 | 5/2003 | Woodruff et al. |
| 2003/0113187 A1 | 6/2003 | Lei et al. |
| 2004/0127142 A1 | 7/2004 | Olgado |
| 2004/0197179 A1 | 10/2004 | Achkire et al. |
| 2005/0031497 A1 | 2/2005 | Siebert et al. |
| 2007/0031236 A1 | 2/2007 | Chen |
| 2007/0034479 A1 | 2/2007 | Todaka |
| 2007/0059127 A1 | 3/2007 | Guo et al. |
| 2007/0207014 A1 | 9/2007 | Toshima |
| 2008/0000422 A1 | 1/2008 | Park et al. |
| 2010/0294199 A1 | 11/2010 | Tran et al. |
| 2012/0063874 A1 | 3/2012 | Kremerman |
| 2013/0059440 A1 | 3/2013 | Wang et al. |
| 2013/0076055 A1 | 3/2013 | Hino et al. |
| 2013/0269609 A1 | 10/2013 | Leeser |
| 2014/0010625 A1 | 1/2014 | Hudgens et al. |
| 2014/0154038 A1 | 6/2014 | Hudgens et al. |
| 2014/0265090 A1 | 9/2014 | Hou |
| 2015/0063957 A1 | 3/2015 | Olgado |
| 2016/0289838 A1 | 10/2016 | Bansal et al. |
| 2016/0307782 A1 | 10/2016 | Weaver et al. |
| 2016/0355927 A1 | 12/2016 | Weaver et al. |
| 2017/0040203 A1 | 2/2017 | Caveney et al. |
| 2017/0040204 A1 | 2/2017 | Kim et al. |
| 2017/0178938 A1 | 6/2017 | Minami et al. |
| 2017/0306493 A1 | 10/2017 | Raj et al. |
| 2018/0033674 A1 | 2/2018 | Jeong et al. |
| 2018/0286728 A1 | 10/2018 | Moura et al. |
| 2019/0164790 A1 | 5/2019 | Liu |
| 2019/0355605 A1 | 11/2019 | Hudgens et al. |
| 2020/0094399 A1 | 3/2020 | Shindo et al. |
| 2020/0402827 A1 | 12/2020 | Uziel et al. |
| 2021/0008727 A1 | 1/2021 | Wirth et al. |
| 2021/0013068 A1 | 1/2021 | Schaller et al. |
| 2021/0013084 A1 | 1/2021 | Schaller et al. |
| 2021/0335635 A1 | 10/2021 | Kalsekar |
| 2022/0020615 A1 | 1/2022 | Pathak et al. |
| 2023/0069317 A1 | 3/2023 | Chandrasekar et al. |
| 2023/0124246 A1 | 4/2023 | Chakravarthy et al. |

FOREIGN PATENT DOCUMENTS

| | | |
|---|---|---|
| CN | 107342243 A | 11/2017 |
| JP | 11163075 A | 6/1999 |
| JP | 2007049157 A | 2/2007 |
| JP | 4951201 B2 | 3/2012 |
| JP | 5463367 B2 | 4/2014 |
| JP | 2016500473 A | 1/2016 |
| KR | 100376963 B1 | 3/2003 |
| KR | 20070053538 A | 5/2007 |
| KR | 101394111 B1 | 5/2014 |
| KR | 20150101785 A | 9/2015 |
| KR | 101715887 B1 | 3/2017 |
| KR | 20190074481 A | 6/2019 |
| TW | 200809947 A | 2/2008 |
| TW | 201139250 A | 11/2011 |
| TW | 201145448 A | 12/2011 |
| TW | 201425189 A | 7/2014 |
| TW | 201624599 A | 7/2016 |
| TW | 201724340 A | 7/2017 |
| WO | 2016038656 A1 | 3/2016 |

OTHER PUBLICATIONS

Application No. PCT/US2020/040994, International Search Report and Written Opinion, Mailed On Oct. 14, 2020, 12 pages.
Application No. PCT/US2020/041015, International Preliminary Report on Patentability, Mailed On Jan. 27, 2022, 10 pages.
Application No. PCT/US2020/041015, International Search Report and Written Opinion, Mailed On Oct. 20, 2020, 13 pages.
Application No. PCT/US2020/041103, International Preliminary Report on Patentability, Mailed On Jan. 27, 2022, 6 pages.
Application No. PCT/US2020/041103, International Search Report and Written Opinion, Mailed On Oct. 13, 2020, 9 pages.
Application No. PCT/US2020/041156, International Preliminary Report on Patentability, Mailed On Jan. 27, 2022, 6 pages.
Application No. PCT/US2020/041156, International Search Report and Written Opinion, Mailed On Oct. 23, 2020, 9 pages.
Application No. PCT/US2020/041157, International Preliminary Report on Patentability, Mailed On Jan. 27, 2022, 10 pages.
Application No. PCT/US2020/041157, International Search Report and Written Opinion, Mailed On Oct. 29, 2020, 13 pages.
Application No. PCT/US2020/041202, International Preliminary Report on Patentability, Mailed On Jan. 27, 2022, 9 pages.
Application No. PCT/US2020/041202, International Search Report and Written Opinion, Mailed On Oct. 29, 2020, 12 pages.
Application No. JP2022-501122, Office Action, Mailed On Jul. 30, 2024, 15 pages.

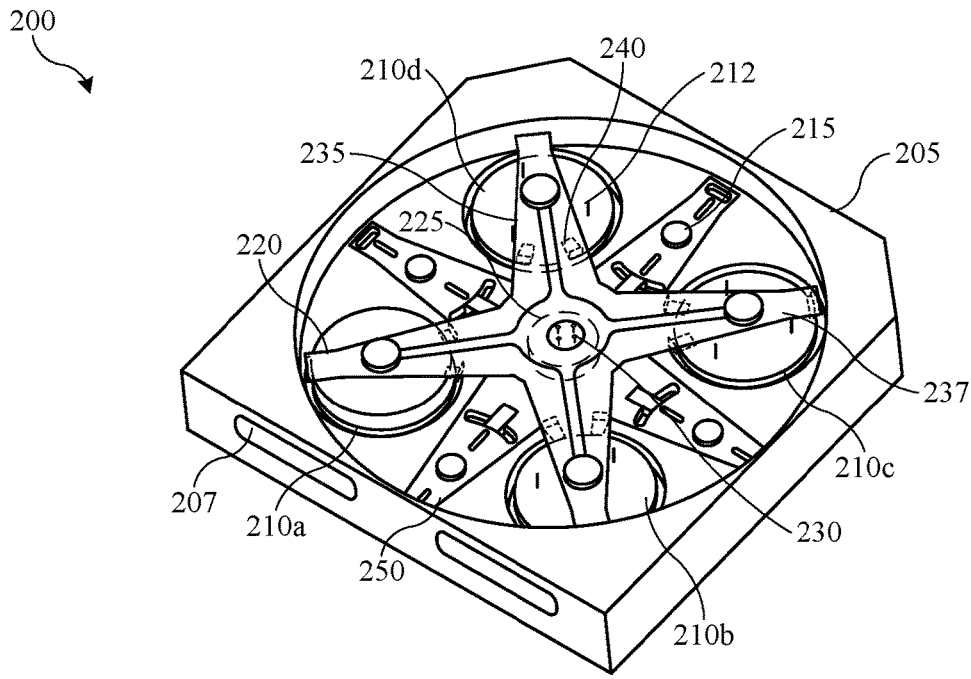
FIG. 2
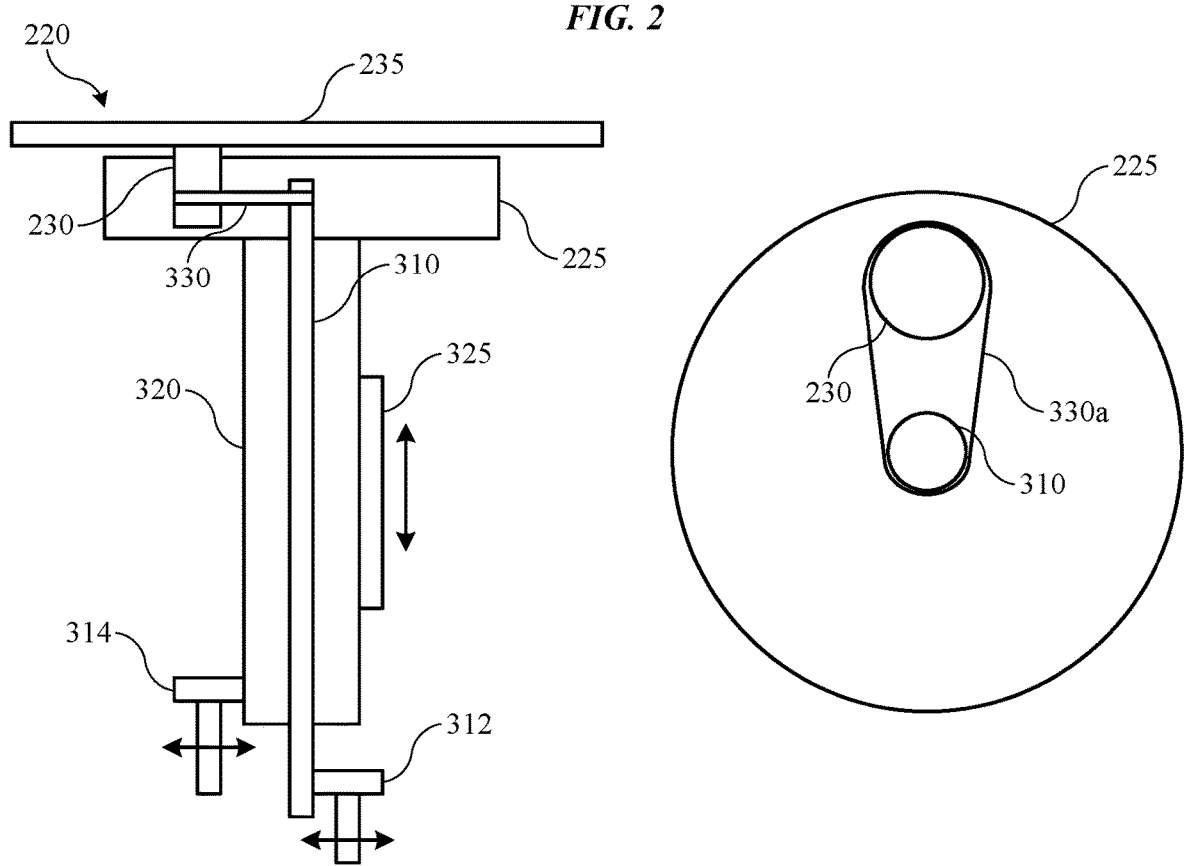 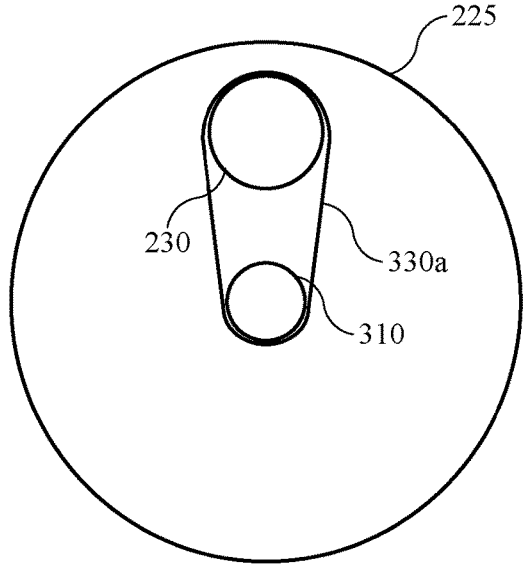
FIG. 3A                              FIG. 3B

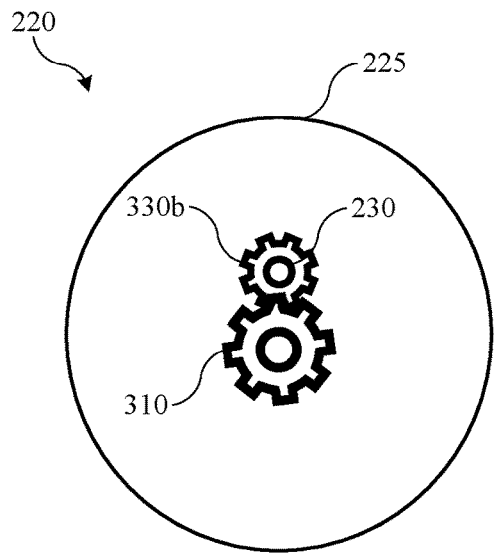
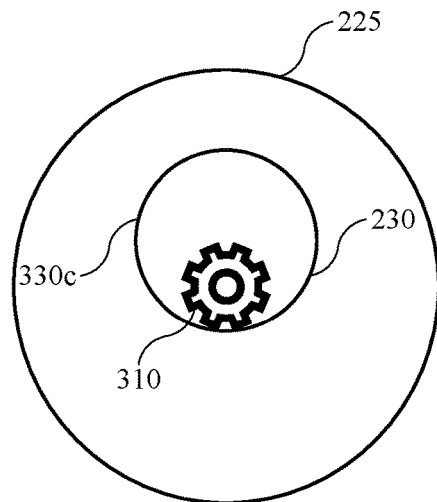
*FIG. 3C*           *FIG. 3D*
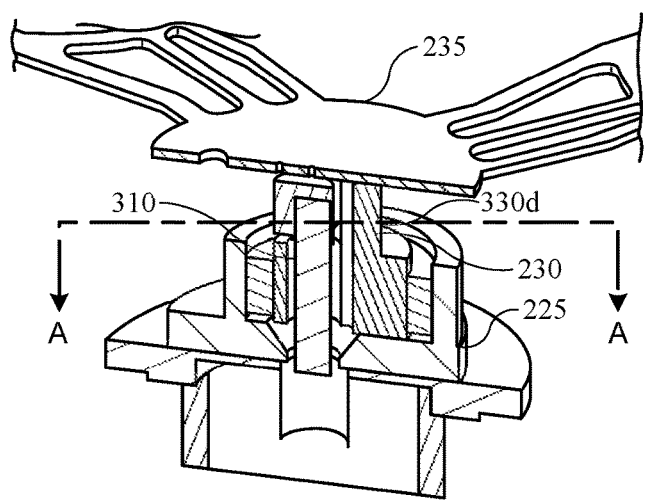
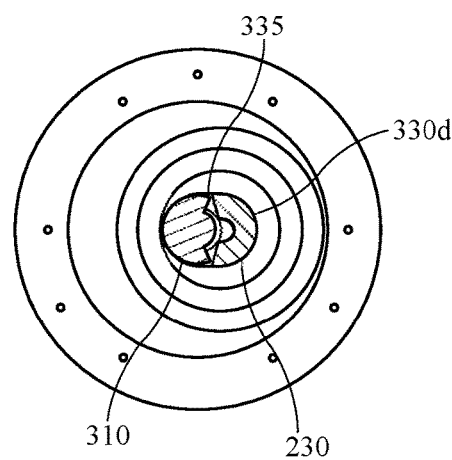
*FIG. 3E*           *FIG. 3F*

ROBOT FOR SIMULTANEOUS SUBSTRATE TRANSFER

CROSS-REFERENCES TO RELATED APPLICATIONS

This application is a continuation of U.S. Non-Provisional patent application Ser. No. 16/922,727, filed 7 Jul. 2020, which claims the benefit of priority of U.S. Provisional Patent Application No. 62/873,458, filed 12 Jul. 2019, the content of which is hereby incorporated by reference in its entirety for all purposes. The present technology is further related to the following applications, all concurrently filed 12 Jul. 2019, and titled: "ROBOT FOR SIMULTANEOUS SUBSTRATE TRANSFER" (U.S. Provisional Patent Application No. 62/873,400), "ROBOT FOR SIMULTANEOUS SUBSTRATE TRANSFER" (U.S. Provisional Patent Application No. 62/873,432), "ROBOT FOR SIMULTANEOUS SUBSTRATE TRANSFER" (U.S. Provisional Patent Application No. 62/873,480), "MULTI-LID STRUCTURE FOR SEMICONDUCTOR PROCESSING SYSTEMS" (U.S. Provisional Patent Application No. 62/873,518), and "HIGH-DENSITY SUBSTRATE PROCESSING SYSTEMS AND METHODS" (U.S. Provisional Patent Application No. 62/873,503). Each of these applications is hereby incorporated by reference in their entirety for all purposes.

TECHNICAL FIELD

The present technology relates to semiconductor processes and equipment. More specifically, the present technology relates to substrate handling systems.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate.

Thus, there is need for improved systems and methods that can be used to efficiently direct substrates within cluster tool environments. These and other needs are addressed by the present technology.

SUMMARY

Exemplary substrate processing systems may include a transfer region housing defining a transfer region fluidly coupled with a plurality of processing regions. A sidewall of the transfer region housing may define a sealable access for providing and receiving substrates. The systems may include a plurality of substrate supports disposed within the transfer region. The systems may also include a transfer apparatus. The transfer apparatus may include a central hub including a first shaft and a second shaft extending about and concentric with the first shaft. The second shaft may be counter-rotatable with the first shaft. The central hub may be characterized by a central axis. The transfer apparatus may include an eccentric hub extending at least partially through the central hub. The eccentric hub may be radially offset from the central axis of the central hub. The eccentric hub may be coupled with the first shaft of the central hub. The transfer apparatus may also include an end effector coupled with the eccentric hub. The end effector may include a plurality of arms having a number of arms equal to the number of substrate supports of the plurality of substrate supports.

In some embodiments, the plurality of substrate supports may include at least four substrate supports. One or more linkages may couple the eccentric hub with the first shaft of the central hub. The one or more linkages may include one or more belts extending about the first shaft or the eccentric hub or a plurality of gears coupled between the first shaft and the eccentric hub. The end effector may also include a plurality of end pieces configured to support a substrate. Each end piece may extend vertically to a similar plane extending orthogonally to the central hub. Each arm may include a first end piece and a second end piece of the plurality of end pieces. The first end piece and the second end piece may be configured to support a substrate during movement of the end effector. Each first end piece and each second end piece may define a recessed ledge and a shelf. The central hub may be vertically translatable along a central axis of the central hub.

Some embodiments of the present technology may also encompass methods of transferring a substrate. The methods may include receiving a substrate at a first substrate support within a transfer region of a substrate processing system. The substrate processing system may include a transfer apparatus positioned within the transfer region. The transfer apparatus may include a central hub including a first shaft and a second shaft extending about and concentric with the first shaft. The transfer apparatus may include an eccentric hub extending at least partially through the central hub. The eccentric hub may be radially offset from a central axis of the central hub. The eccentric hub may be coupled with the first shaft of the central hub. The transfer apparatus may include an end effector coupled with the eccentric hub, and the end effector may include a plurality of arms. The methods may include engaging the substrate with an arm of the plurality of arms. The methods may include rotating the second shaft in a first direction about a central axis of the central hub. The methods may include rotating the first shaft in the first direction about the central axis of the central hub at a fixed ratio with the second shaft to radially reposition the substrate about the central axis within the transfer region. The methods may include delivering the substrate to a second substrate support within the transfer region of the substrate processing system.

In some embodiments, the methods may include transitioning the transfer apparatus by further rotating the first shaft in the first direction or a second direction opposite the first direction about the central axis at an increased rate from a rate of the fixed ratio to laterally reposition the substrate along a radius extending from the central axis within the transfer region. The methods may include, subsequent engaging the substrate, lifting the substrate from the first substrate support by translating the transfer apparatus vertically within the transfer region of the substrate processing system. The methods may also include, subsequent engaging the substrate, recessing the first substrate support from the substrate. Each arm of the end effector may include a first end piece and a second end piece. Each first end piece and each second end piece may define a recessed ledge and a shelf. Engaging the substrate may include rotating the arm across the substrate to position the substrate between the arm and the shelf of the first end piece and the shelf of the second end piece. The substrate processing system may include at least four substrates, and engaging the substrate may include individually or simultaneously engaging the at least four substrates with the end effector. The methods may also include, prior to delivering the substrate to the second substrate support, delivering the substrate to an alignment hub positioned between the first substrate support and the second substrate support.

Some embodiments of the present technology may encompass substrate processing systems including a transfer region housing defining a transfer region fluidly coupled with a plurality of processing regions. A sidewall of the transfer region housing may define a sealable access for providing and receiving substrates. The transfer region may include a plurality of substrate supports disposed within the transfer region. The systems may include a transfer apparatus positioned within the transfer region. The transfer apparatus may include a central hub including a first shaft and a second shaft extending about the first shaft. The second shaft may be counter-rotatable with the first shaft. The central hub may be characterized by a central axis. The transfer apparatus may include an eccentric hub extending at least partially through the central hub. The eccentric hub may be radially offset from the central axis of the central hub. The eccentric hub may be coupled with the first shaft of the central hub with one or more linkages. The transfer apparatus may also include an end effector coupled with the eccentric hub. The end effector may include a plurality of arms having a number of arms equal to the number of substrate supports of the plurality of substrate supports.

In some embodiments the end effector may also include a plurality of end pieces configured to support a substrate. Each end piece may extend vertically to a similar plane extending orthogonally to the central hub. Each arm may include a first end piece and a second end piece of the plurality of end pieces. The first end piece and the second end piece may be configured to support a substrate during movement of the end effector. The central hub may be vertically translatable along the central axis of the central hub.

Such technology may provide numerous benefits over conventional systems and techniques. For example, the transfer systems may provide lateral transfer capabilities in addition to rotational movement for substrate transfer. Additionally, the transfer systems may accommodate transfer regions of substrate processing chambers having multiple rows of substrates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 2 shows a schematic isometric view of a transfer section of an exemplary substrate processing system according to some embodiments of the present technology.

FIG. 3A shows a schematic cross-sectional view of an exemplary transfer apparatus according to some embodiments of the present technology.

FIGS. 3B-3F show schematic top plan views of exemplary transfer apparatus components according to some embodiments of the present technology.

Figure 1A:
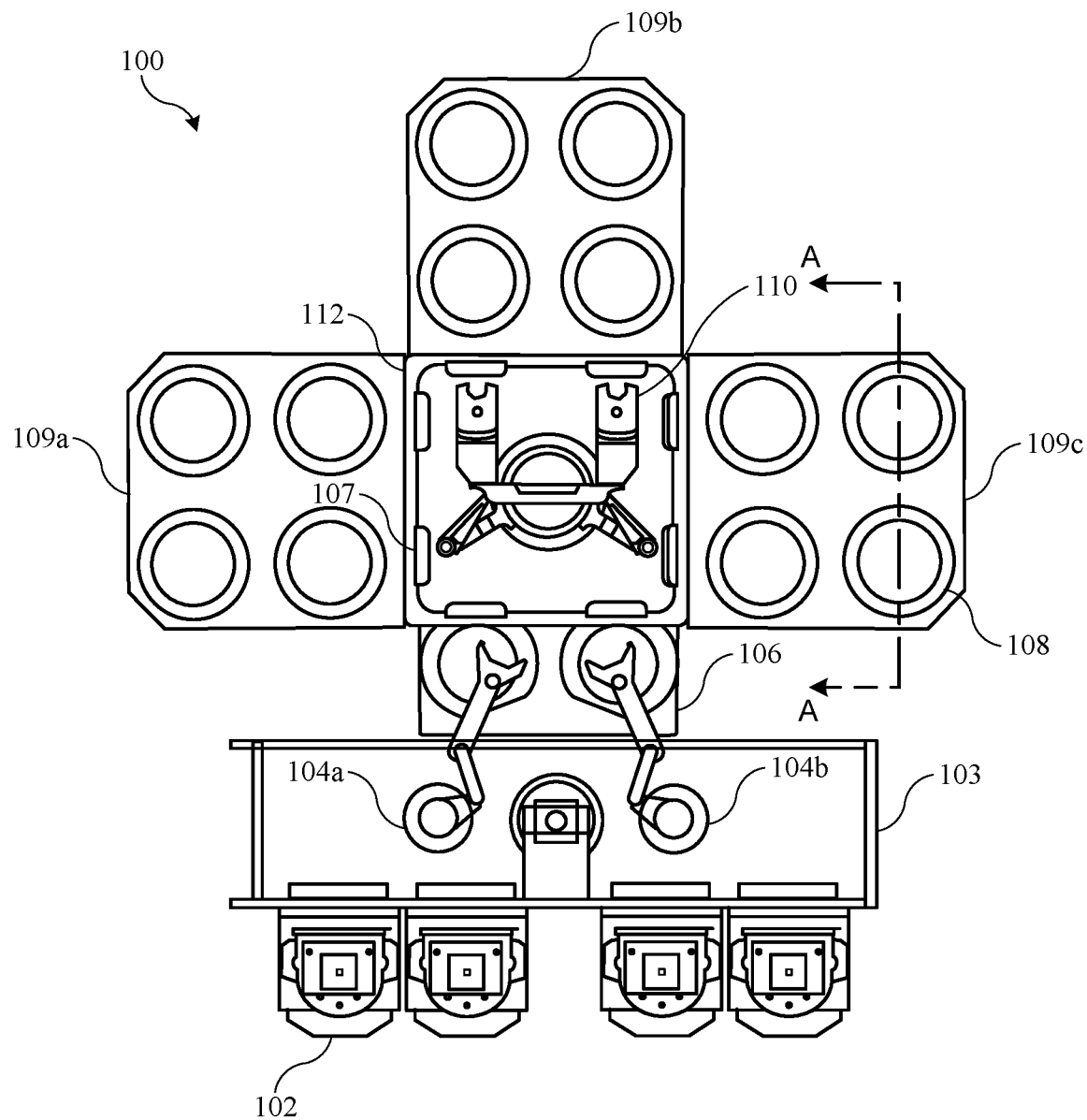
FIG. 1A shows a schematic top plan view of one embodiment of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region. Although the remaining disclosure will routinely identify specific structures, such as four-position transfer regions, for which the present structures and methods may be employed, it will be readily understood that the systems and methods are equally applicable to any number of structures and devices that may benefit from the transfer capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
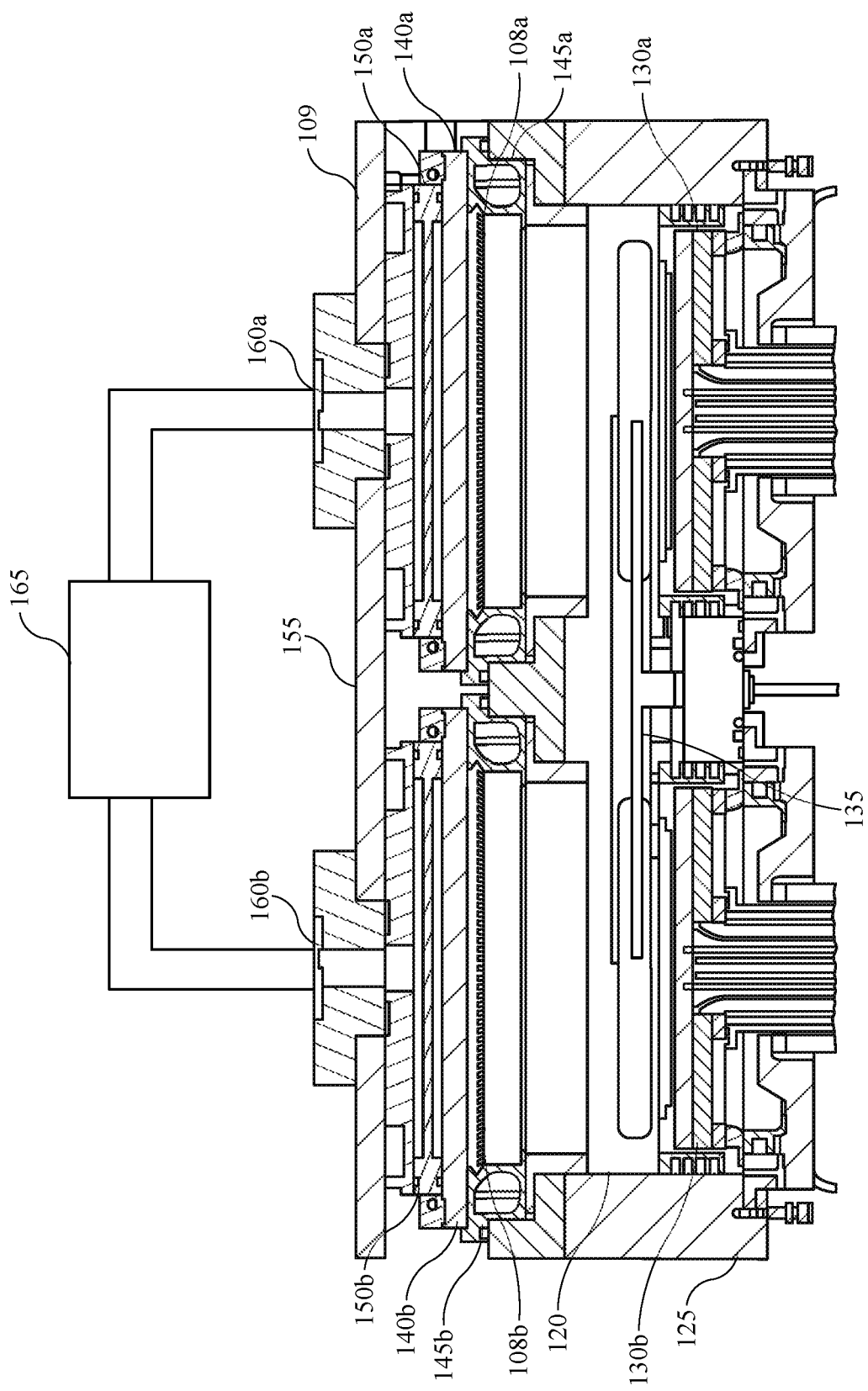
FIG. 1B shows a schematic partial cross-sectional view of an exemplary chamber system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109, such as illustrated through like A-A in FIG. 1A. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

As noted, processing system 100, or more specifically quad sections or chamber systems incorporated with system 100 or other processing systems, may include transfer sections positioned below the processing chamber regions illustrated. FIG. 2 shows a schematic isometric view of a transfer section of an exemplary substrate processing system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that transfer section 200 may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access for alignment systems 215, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. Although exemplary operations will be described below, in one example, transfer apparatus 220 may move substrates on substrate supports 210a and 210b to substrate supports 210c and 210d, which may allow additional substrates to be delivered into the transfer chamber.

Transfer apparatus 220 may include a central hub 225 that may include one or more shafts extending into the transfer chamber. The transfer apparatus may additionally include an eccentric hub 230 extending at least partially through the central hub 225. The eccentric hub may be radially offset from a central axis through the central hub, and may be independently rotatable from the central hub. These separate rotations, and offset of the eccentric hub 230, may facilitate multiple aspects of translation including rotational and lateral as will be explained further below. Coupled with the eccentric hub 230 may be an end effector 235. End effector 235 may include a plurality of arms 237 extending radially or laterally outward from the central or eccentric hub. Although illustrated with a central body from which the arms extend, the end effector may additionally include separate arms that are each coupled with the eccentric hub 230. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate.

The end effector 235 may additionally include a plurality of end pieces 240, as will be described further below, and may be configured to support a substrate. The end pieces 240 may be coupled with arms of the plurality of arms 237. Any number of end pieces may be included with each arm of the end effector, such as two, three, four, or more end pieces, and which may be positioned on or coupled with the arms to allow the arms of the end effector to swing below or above substrates without contacting them, and then seat a substrate for movement within the transfer region. The end pieces will be described in more detail below, and may be used to contact substrates during transfer or movement. The end pieces as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics. Component couplings may also be adapted for operation in high temperature and/or corrosive environments. For example, where end effectors and end pieces are each ceramic, the coupling may include press fittings, snap fittings, or other fittings that may not include additional materials, such as bolts, which may expand and contract with temperature, and may cause cracking in the ceramics. In some embodiments the end pieces may be continuous with the end effectors, and may be monolithically formed with the end effectors. Any number of other materials may be utilized that may facilitate operation or resistance during operation, and are similarly encompassed by the present technology.

A floor of the transfer region housing 205 may additionally define a space 250 within which the end effector may be recessed when not in use. As illustrated, space 250 may be defined between substrate supports, and may be shaped to define a profile of the end effector 235 or components of the end effector. For example, recesses may be defined within the space to accept end pieces, which may extend below arms 237 of the end effector 235. Additionally, space 250 may extend about alignment system 215 in some embodiments, which may allow the end effector 235 to be used to cover components of the alignment system in some embodiments, such as during substrate processing, which may protect the aligner and other alignment components from processing effluents within the processing system.

The transfer apparatus 220 may include a number of components and configurations that may facilitate the movement of the end effector and/or eccentric hub independently from the central hub as will be described further below. FIG. 3A shows a schematic cross-sectional view of an exemplary transfer apparatus 220 according to some embodiments of the present technology, although it is to be understood that any other configurations affording the independent rotational movement to be described are similarly encompassed by the present technology.

Central hub 225 may include a first shaft 310 and a second shaft 320, which may be axially aligned with first shaft 310 in some embodiments. For example, first shaft 310 and second shaft 320 may be concentric about a central axis extending vertically through the central hub. In some embodiments first shaft 310 may extend through second shaft 320, or aspects of second shaft 320. As illustrated in FIG. 3A, first shaft 310 and second shaft 320 may be coaxial, although the two shafts may be coupled with separate motor or drive systems. As illustrated, first shaft 310 may be coupled with a first drive system 312, which may include a motor, and which may allow rotation about the central axis. This rotation may rotate linkages 330 in a first direction, or in a second direction opposite the first, the movement of which may rotate eccentric hub 230 in a first direction about a central axis through the eccentric hub, or in a second direction opposite the first. Similarly, second shaft 320 may be coupled with a second drive system 314, which may independently allow rotation of central hub 225 in a first direction or a second direction about the central axis.

As will be described further below, eccentric hub 230 may be rotatable about the central axis of central hub 225, which may be operated through controlled rotation of the first shaft and the second shaft to produce linear motion or substantially linear motion of the end effector 235. In some embodiments a vertical translation drive 325 may be included, which may allow the transfer apparatus to be vertically translated along the central axis. This may facilitate lifting substrates from substrate supports or lift pins in some embodiments, although in some embodiments the lift pins and/or substrate supports may be used to raise and lower substrates, and transfer apparatus 220 may not include a vertical drive mechanism.

The eccentric hub may be disposed at least partially within the central hub 225, and may extend through the central hub 225 housing to couple with end effector 235, or may include an extension post or linkage to couple with end effector 235. Eccentric hub 230 may be at least partially decoupled from central hub 225, which may facilitate rotation of the eccentric hub independently from rotation of central hub 225. The eccentric hub 230 may be coupled directly or indirectly with first shaft 310 of the central hub, and which may allow rotation of the eccentric hub 230 when first shaft 310 is rotated. Eccentric hub 230 may be positioned offset from the central axis of the central hub, and may be radially offset from the central axis. The eccentric hub may be characterized by a corresponding eccentric hub axis extending through the eccentric hub 230 and defining an axis of rotation for an the eccentric hub as well as the end effector in some embodiments. Additionally, end effector 235 may be centrally coupled with eccentric hub 230, or a central axis of the end effector may be offset from a central axis through the eccentric hub. For example, end effector 235 may be axially aligned with a central axis of central hub 225, or may be offset from each of the central hub and the eccentric hub. These offsets may affect an outer radius of a sweep path of the end effector in some embodiments.

As previously noted, eccentric hub 230 may not be directly coupled with central hub 225, or may be rotatably coupled through the housing, which may facilitate independent rotation between the eccentric hub and the central hub, and which may produce multiple rotational aspects for the transfer apparatus 220, which may cooperate to provide lateral movement in addition to rotational movement. First shaft 310 may extend within the central hub 225, and may provide an amount of access for coupling linkages 330 about the first shaft. As shown, the linkages may couple the eccentric hub 230 with the first shaft 310 within the central hub housing. Consequently, when the first shaft 310 is rotated by first drive system 312, the linkages coupling the shaft with the eccentric hub may cause the hub to similarly rotate about an eccentric axis offset radially from the central axis of the transfer apparatus or central hub as noted above. As the eccentric hub rotates with rotation of first shaft 310, end effector 235 may also rotate in a direction corresponding to or associated with a direction of rotation of the first shaft 310 and/or eccentric hub 230.

FIGS. 3B-3F show schematic top plan views of exemplary components of transfer apparatus 220 according to some embodiments of the present technology. Although only some aspects of a transfer apparatus as previously described may be illustrated, it is to be understood the illustrations are not intended to be limiting and may include any of the components, materials, or characteristics of transfer apparatus 220 described previously. Additionally, the figures may illustrate linkages included with any of the previously described transfer apparatuses or embodiments of the present technology.

As illustrated, transfer apparatus 220 may include a central hub 225. Although central hub 225 may include a covered lid portion as illustrated previously, the lid is not shown in the illustration to facilitate viewing exemplary linkages encompassed by the present technology. First shaft 310 may extend within central hub 225, and may be coupled with eccentric hub 230 as previously described. Linkage 330a is illustrated in one embodiment in which one or more belt couplings may be used and may extend about eccentric hub 230 as well as first shaft 310 in a number of ways. The belt or belts may extend within grooves or trenches defined in each of the eccentric hub and first shaft.

Additionally, twisted belts may be incorporated to reverse rotations between components. Individual or multiple belts may be used in different embodiments, although additional linkage systems may similarly be used. For example, as illustrated in FIG. 3C, a gear set may be used to drive the eccentric hub as illustrated. For example, first shaft 310 may define a number of gear teeth along a region extending within central hub 225. The gear teeth may be interconnected with teeth of a linkage gear 330b, such as a pinion gear, which may be connected with or may extend about eccentric hub 230 of the transfer apparatus. Additional gears may also be incorporated in any number of configurations to facilitate rotation of the eccentric hub from rotation of the first shaft 310. For example, as illustrated in FIG. 3D, a pinion gear may be fixedly coupled with first shaft 310, and may rest within an internal radius of a planetary gear 330c. Planetary gear 330c may be coupled with or as eccentric hub 230, and which may rotate with the planetary gear movement.

FIGS. 3E-3F illustrate an additional coupling in which half-pulleys may be incorporated to reduce the offset of the eccentric hub according to some embodiments of the present technology. As illustrated, first shaft 310 may extend up through central hub 225. First shaft 310 may be characterized by a half pulley at a distal end of the first shaft proximate the end effector 235. The half pulley may be coupled with a half pulley 330d of the eccentric hub 230. Eccentric hub 230 may at least partially extend about first shaft 310 as illustrated, and may include a protruding half pulley to couple with the half pulley at the distal end of the first shaft. In some embodiments one or more bands 335 or other coupling materials may be used to join the eccentric hub half pulley and the half pulley of the first shaft 310, as shown in FIG. 3F, which is a cross section along line A-A of FIG. 3E. FIGS. 3B-3F illustrate three possible linkage systems encompassed by the present technology, and the illustrations are not intended to be limiting.

Any number of other system component couplings configured to provide the described operations are similarly encompassed by the present technology. Moreover, because the linkage connections may include a number of gears, twisted belts, and other components that may cause eccentric hub 230 to rotate in a similar direction as first shaft 310 or a different direction, it is to be understood that any embodiment described throughout the present disclosure may consider this effect. For example, a first direction of shaft rotation may cause an associated eccentric hub to rotate in either direction, and thus when first and second directions are described, either direction may actually be encompassed to accommodate the movement illustrated or described, and which may account for any type of actual linkage coupling encompassed in any individual example.

Figure 4A:
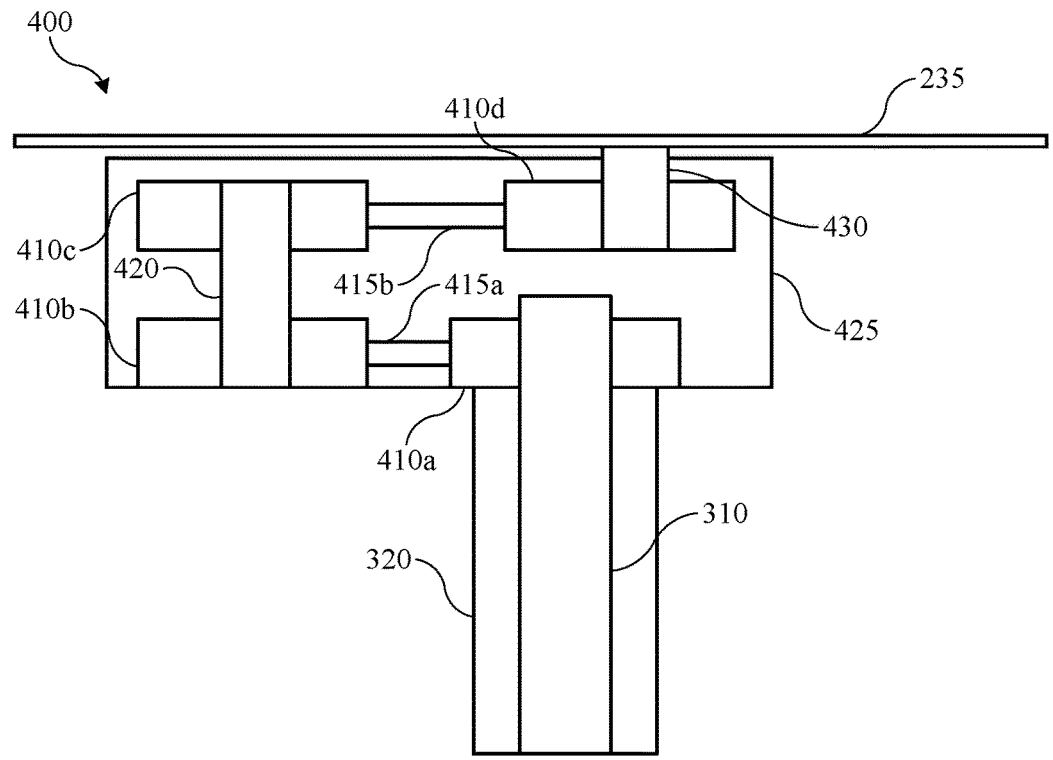
FIG. 4A shows a schematic cross-sectional view of an exemplary transfer apparatus according to some embodiments of the present technology.

FIG. 4A shows a schematic cross-sectional view of another exemplary transfer apparatus 400 according to some embodiments of the present technology, which may include any of the components, materials, or characteristics previously described. FIG. 4A may illustrate a pulley system that may be used to separately rotate an eccentric hub, which may be coupled with an end effector 235 as previously described. Transfer apparatus 400 may include a central hub 425 having a housing in which a number of pulley components may be contained. As previously described, central hub 425 may include a first shaft 310 and a second shaft 320, which may be rotatable with separate drive systems as noted above.

First shaft 310 may be coupled with eccentric hub 430 with a set of pulleys and linkages allowing eccentric hub 430 to be radially offset from first shaft 310. Second shaft 320 may be coupled with central hub 425, the rotation of which may rotate all of the components together, which may rotationally translate the substrates seated on arms of the end effector 235. Rotation of the first shaft 310 separately from the second shaft 320 may provide an additional translational movement, which may be used to provide lateral translation of the substrate in some embodiments.

A first pulley 410a may be coupled about first shaft 310, and coupled with a second pulley 410b with a first linkage 415a. Second pulley 410b may be laterally offset from the first pulley 410a, and accommodated by the housing of central hub 425. Second pulley 410b may include a fixed linkage 420, such as an additional shaft, connecting the second pulley to a third pulley 410c, which may be vertically offset from second pulley 410b. Third pulley 410c may be coupled with a fourth pulley 410d with a second linkage 415b. Fourth pulley 410d may be coupled about eccentric shaft 430, which may be offset from first shaft 310 to provide a second axis of eccentric movement of end effector 235. Pulleys 410 may be sized similarly or differently, and linkages 415 may include any number or combination of linkages discussed above or as would be understood to be otherwise encompassed by the present technology to allow rotation or operation of the pulley system.

Figure 4B:
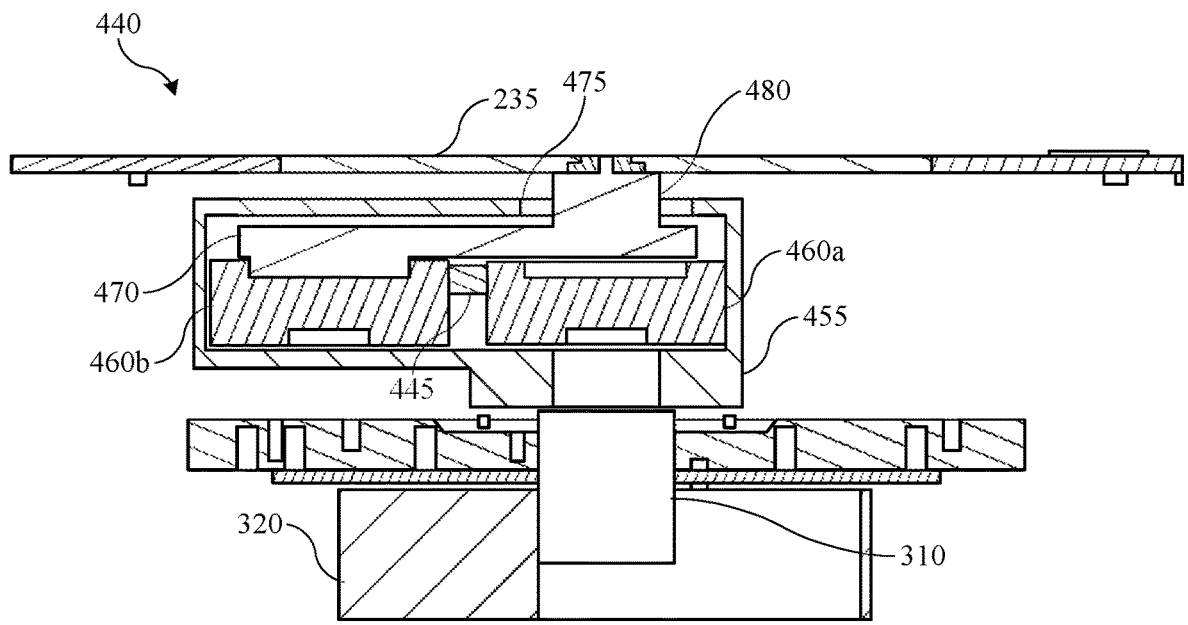
FIG. 4B shows a schematic cross-sectional view of an exemplary transfer apparatus according to some embodiments of the present technology.

FIG. 4B shows a schematic cross-sectional view of an exemplary transfer apparatus 440 according to some embodiments of the present technology, which may include any of the components, materials, or characteristics previously described, and may include a variation or alteration of aspects of transfer apparatus 400 described above. FIG. 4B may illustrate a partial pulley system and swing arm that may be used to separately rotate an eccentric hub, which may be coupled with an end effector 235 as previously described. Transfer apparatus 440 may include a central hub 480 having a housing in which a number of pulley components may be contained. As previously described, central hub 480 may include a first shaft 310 and a second shaft 320, which may be rotatable with separate drive systems as noted above.

First shaft 310 may be coupled with eccentric hub 455 with a set of pulleys and linkages allowing eccentric hub 455 to be radially offset from first shaft 310, and to swing across a central axis through first shaft 310 in some embodiments. Second shaft 320 may be coupled with central hub 480, the rotation of which may rotate all of the components together, which may rotationally translate the substrates seated on arms of the end effector 235. Rotation of the first shaft 310 separately from the second shaft 320 may provide an additional translational movement, which may be used to provide lateral translation of the substrate in some embodiments.

A first pulley 460a may be coupled about first shaft 310, and coupled with a second pulley 460b with a linkage 445. Second pulley 460b may be laterally offset from the first pulley 460a as previously described, and may be accommodated by the housing of central hub 480. Second pulley 460b may be coupled with a swing arm 470, which may be vertically offset from second pulley 460b. Swing arm 470 may extend back within the housing of the central hub 480 towards the first pulley 460a. The swing arm 470 may be offset from first shaft 310 to provide a second axis of eccentric movement of end effector 235, although in some embodiments, rotation of swing arm 470 from second pulley 460b may drive swing arm 470 along an arcuate path within the housing, providing movement of the eccentric hub 455 and end effector 235. The movement may be coordinated with rotation of the second shaft 320 and components to provide lateral movement of the end effector 235 as previously described. Eccentric hub 455 may be fixedly coupled with the swing arm 470, or may be an extension of swing arm 470 in some embodiments. A gap 475 or path may be defined within the housing to accommodate movement of the eccentric hub 455 from the swing of swing arm 470 in some embodiments. Again, pulleys 444 may be sized similarly or differently, and linkages 445 may include any number or combination of linkages discussed above or as would be understood to be otherwise encompassed by the present technology to allow rotation or operation of the pulley system.

Figure 4C:
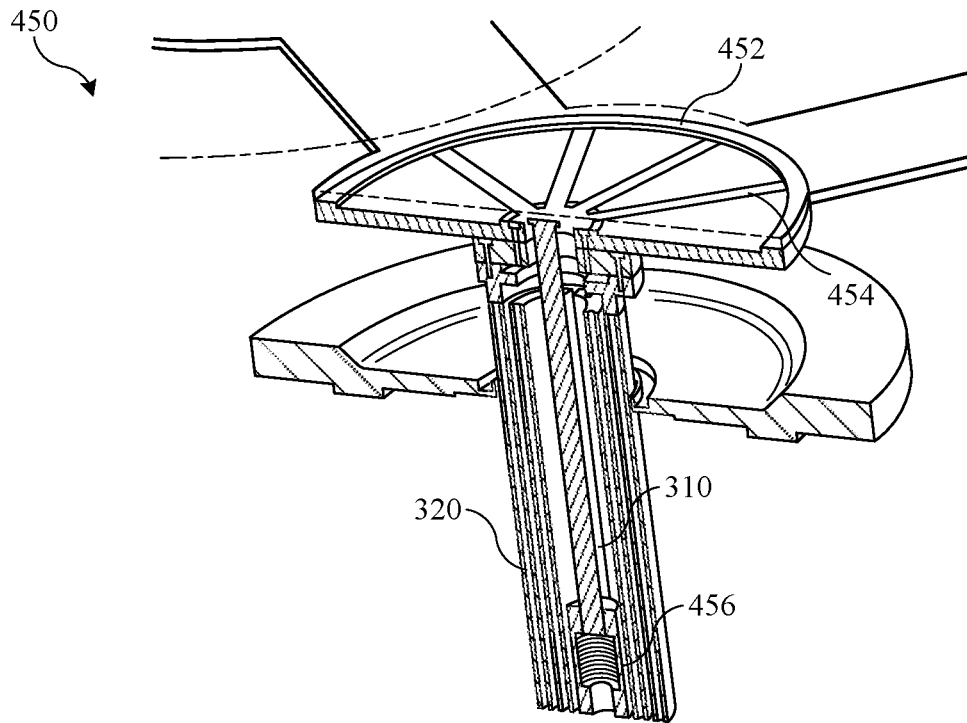
FIG. 4C shows a schematic cross-sectional view of an exemplary transfer apparatus according to some embodiments of the present technology.

FIG. 4C may show a schematic cross-sectional view of an exemplary transfer apparatus 450 according to some embodiments of the present technology, which may include any of the components, materials, or characteristics previously described, and may include a variation or alteration of aspects of transfer apparatus 400 described above. FIG. 4C may illustrate an additional offset transfer apparatus, which may be coupled with an end effector 235 as previously described, and provide an amount of linear translation of the end effector in addition to the rotational movement, as described previously. Transfer apparatus 450 may include a central hub 452 having a plurality of arms 454 providing linear stability during movement. As previously described, central hub 452 may include a first shaft 310 and a second shaft 320, which may be rotatable with separate drive systems as noted above.

First shaft 310 may be coupled with a flexible drive 456 at a proximal end of the first shaft 310 relative to end effector 235 coupled with a distal end of first shaft 310. Flexible drive 456 may be driven to bend first shaft 310 outward from a central axis through the transfer apparatus. Second shaft 320 may include an enlarged opening through which first shaft 310 may extend, and within which first shaft 310 may radially lean, which may provide linear extension of end effector 235. By positioning flexible drive 456 along a length of first shaft 310, the further away from the end effector at an opposite end of the first shaft may be located, the less distance flexible drive 456 may drive first shaft 310 to provide an increased linear translation of substrates in an eccentric fashion. For example, were flexible drive 456 located proximate end effector 235, driving or bending first shaft 310 would only marginally translate the end effector, such as slightly more than a 1:1 ratio. However, when flexible drive 456 is located further from end effector 235 as shown, a relatively small offset bend may produce greater than or about two times the distance movement from the central axis of the end of first shaft 310 with which end effector 235 may be coupled, and may produce greater than or about three times the distance of movement, greater than or about four times the distance of movement, greater than or about five times the distance of movement, greater than or about six times the distance of movement, greater than or about seven times the distance of movement, greater than or about eight times the distance of movement, greater than or about nine times the distance of movement, greater than or about ten times the distance of movement, or more. Flexible drive 456 may be bent in any direction from the central axis.

When first shaft 310 is driven by flexible drive 456, the tilt which may beneficially provide lateral translation of end effector 235 may similarly provide a tilt on the wafer if not compensated. In some embodiments, arms 454 of the central hub 452 may provide a compensating force or tilt opposite the tilt direction produced by flexible drive 456. Accordingly, in some embodiments, arms 454 may maintain a substrate seated on or with end effector 235 substantially parallel to a surface of a substrate support, and may reduce or limit an amount of tilt during lateral adjustment of the substrate position. For example, while first shaft 310 may tilt within the wheel of central hub 452, arms 454 may bend to compensate this tilt, maintaining a planarity of central hub 452 that may maintain a substrate substantially parallel with a substrate support. In some embodiments, arms 454 may compensate for greater than or about 90% of tilt induced by movement of the flexible drive 456, and may compensate for greater than or about 91% of tilt, greater than or about 92% of tilt, greater than or about 93% of tilt, greater than or about 94% of tilt, greater than or about 95% of tilt, greater than or about 96% of tilt, greater than or about 97% of tilt, greater than or about 98% of tilt, greater than or about 99% of tilt, or may fully compensate for tilt of first shaft 310 produced by flexible drive 456 in some embodiments.

Figure 4D:
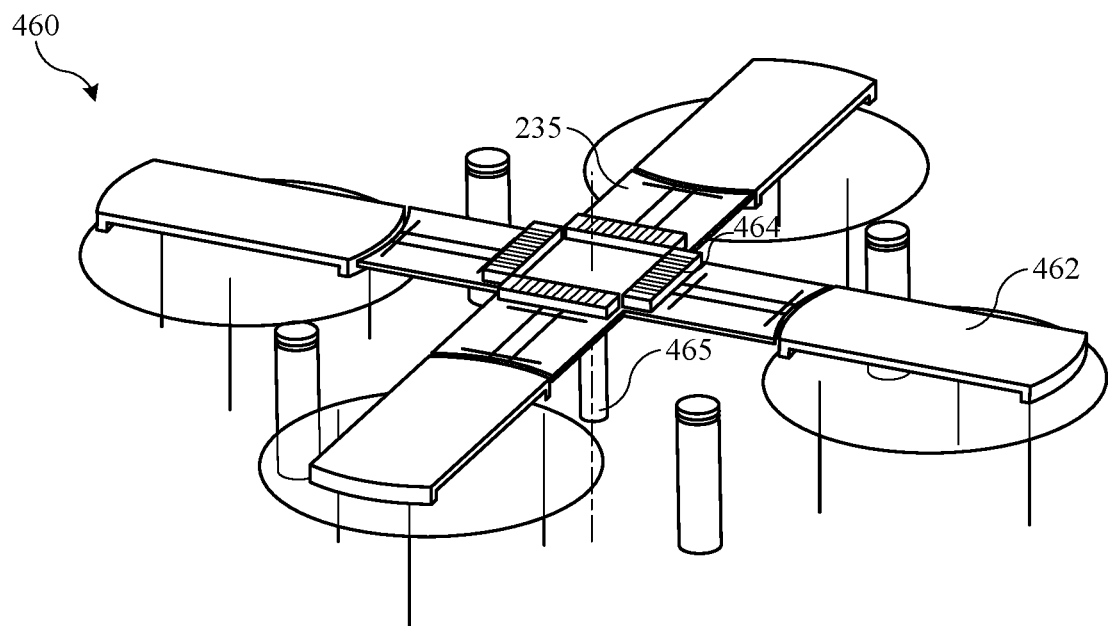
FIG. 4D shows a schematic cross-sectional view of an exemplary transfer apparatus according to some embodiments of the present technology.

FIG. 4D shows a schematic cross-sectional view of an exemplary transfer apparatus 460 according to some embodiments of the present technology, which may include any of the components, materials, or characteristics previously described, and may include a variation or alteration of aspects of transfer apparatus 400 described above. FIG. 4D may illustrate an additional exemplary apparatus providing linear translation of substrates positioned on or with the transfer apparatus in some embodiments. Transfer apparatus 460 may include end effectors 235 having arms 462 coupled with a flexure 464. The number of flexures 464 may be equal to the number of arms 462 in some embodiments, which may provide independent movement of each arm 462. While some of the previously noted configurations may provide an offset of the entire end effector, transfer apparatus 460 may only operate flexures 464 to linearly move an associated arm 462. Accordingly, in some embodiments, only a single, rotatable shaft 465 may be coupled with end effector 235. Shaft 465 may allow wiring to extend through the shaft, which may then be coupled with flexures 464, allowing operation. The flexures may be operated to extend linearly, such as through an arcuate deformation, in one or either direction along an axis through an associated arm 462 to extend or retract the associated arm 462 and substrate a distance to facilitate placement of the substrate in some embodiments. The flexures may be any type of flexure, or deformation material, and may be linear flexures in some embodiments. The flexure drive may also be any drive, and in some embodiments may be a piezo drive motor, for example. When energized, the piezo or other drive, may cause deformation of or within the flexure producing an outward or inward bend, which may produce the linear movement of the coupled arm.

Figure 5:
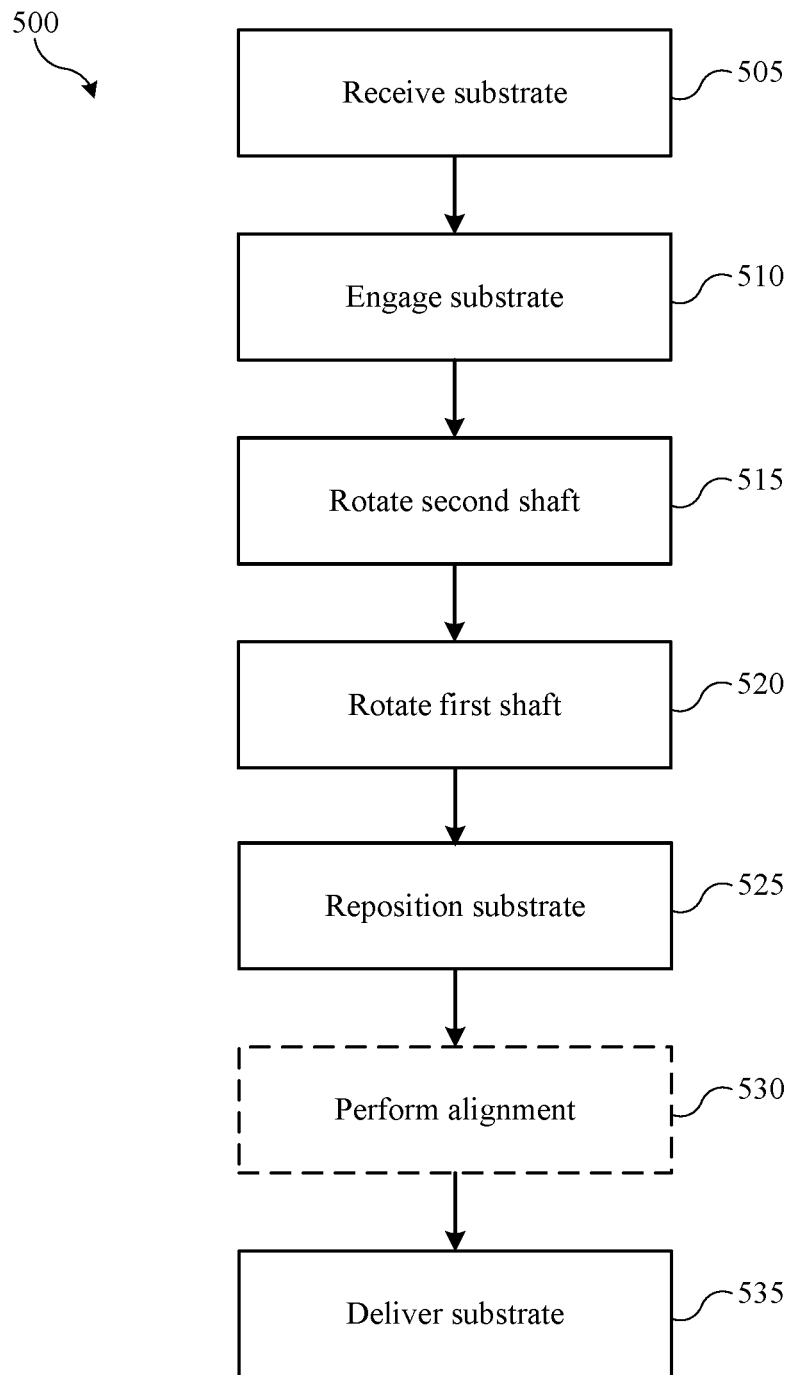
FIG. 5 shows exemplary operations in a method of transferring substrates according to some embodiments of the present technology.

FIG. 5 shows exemplary operations in a method 500 of transferring a substrate according to some embodiments of the present technology. Method 500 may be performed in one or more semiconductor processing systems having a transfer region, such as transfer section 200, which may be incorporated into processing system 100, for example. The method may include a number of optional operations as denoted in the figure, which may or may not be specifically associated with some embodiments of methods according to the present technology. Method 500 describes operations shown schematically in FIGS. 6A-6F, the illustrations of which will be described in conjunction with the operations of method 500. It is to be understood that FIG. 6 illustrates only partial schematic views with limited details, and in some embodiments the systems may include more or less substrate supports and other components, as well as alternative structural aspects that may still benefit from any of the aspects of the present technology.

Figure 6A:
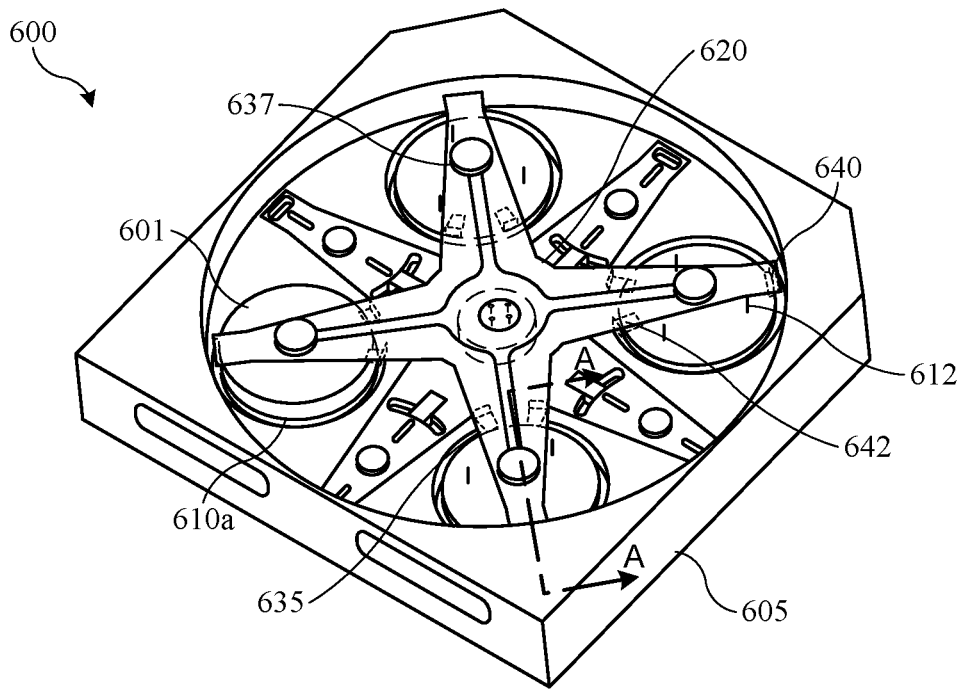
FIGS. 6A-6F show schematic top plan views of substrates being transferred according to some embodiments of the present technology.

FIG. 6A may illustrate a transfer section 600 of a substrate processing system as previously described, and may include any of the features and aspects of transfer section 200 described above, including any of the drive components discussed previously with FIG. 3 or 4, as well as any other drive components as would be understood are similarly encompassed by the present technology. Additionally, system 600 may be illustrated with a substrates 601 disposed within the transfer section, such as seated on substrate support 610 as illustrated. The figure may show a configuration of the present technology subsequent initial operations of method 500, which may include receiving a substrate at a first substrate support 610a at operation 505, such as through an access with a robot from a transfer chamber as previously described. The robot may deliver one or two, or more, substrates into the transfer region housing 605 onto the substrate supports proximate the accesses or slit valves. Transfer apparatus 620 may rotate the substrate or substrates to the opposite substrate supports, and additional substrates may be delivered. It is to be understood that the same process can be performed with any number of substrates, including delivery of one substrate at a time into the processing chamber as illustrated. FIG. 6A may illustrate after a substrate has been positioned within the transfer chamber, and the transfer apparatus 620 may be positioned over substrate 601 to receive the substrate for transfer to a second substrate support.

A transfer process may involve rotating the transfer apparatus in a number of ways. Method 500 may include engaging the substrates 601 at operation 510. The engagement may occur simultaneously or individually until one or more substrates have been transferred from substrate supports 610, including lift pins 612 of the substrate supports, to arms 637 of transfer apparatus 620. Depending on the transfer apparatus having vertical movement capabilities or not, the engagement and movement may or may not include raising or lowering one or both of the substrates or the transfer apparatus. Once the substrates have been engaged by the transfer apparatus, a complete transfer of the substrate or substrates may be made between the substrate supports and the transfer apparatus. For example, in some embodiments the transfer apparatus may lift the substrates from the substrate supports or lift pins on which the substrates may be seated. This may be performed by vertically translating the transfer apparatus, for example. In some embodiments, the substrate supports may recess away from the substrate or substrates to complete the transfer.

The engagement of the substrate may occur as a passive engagement in some embodiments of the present technology, in which transfer apparatus 620 may provide a shelf on which substrate 601 may be seated. For example, and as noted previously, each arm 637 of an end effector 635 on transfer apparatus 620 may include a number of end pieces coupled with the end effector, and which may include one or more first end pieces 640, and one or more second end pieces 642. The end pieces may be positioned across from one another to maintain a distance across the arms 637 that are free of any extensions or end pieces, and which may facilitate a sweep of the arm across a substrate in either direction to position end pieces proximate the substrate, and facilitate a transfer of the substrate from the substrate support or lift pins to the transfer apparatus.

Figure 6B:
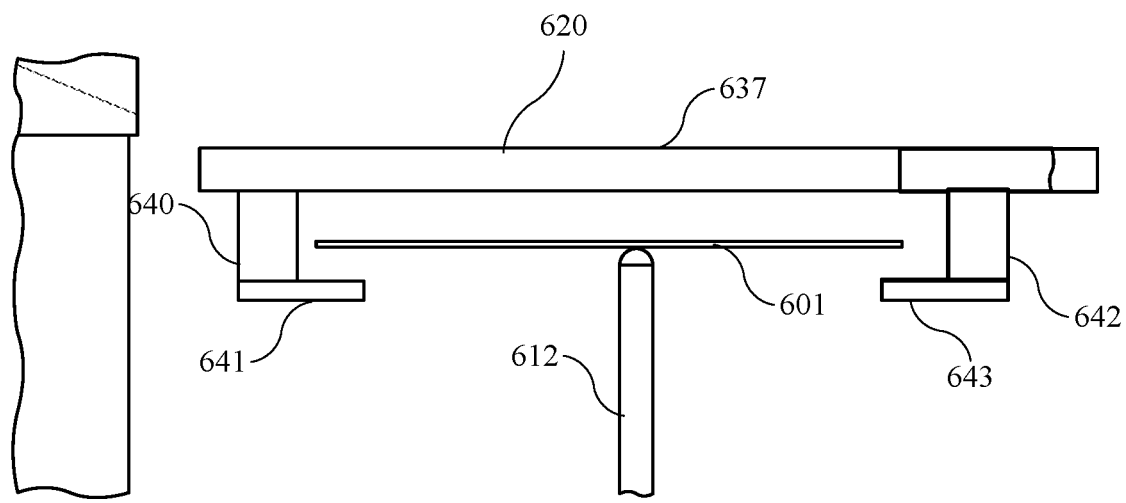

FIG. 6B shows an illustration of engagement as may be performed by the present technology. As illustrated from FIG. 6A, an arm 637 of transfer apparatus 620 may sweep across a substrate 601 positioned on lift pins 612. End pieces 640, 642 may be aligned across the substrate to engage the substrate, which may then be lowered on the end pieces for transfer. Alternatively or concurrently, the end pieces 640, 642 may be raised to engage the substrate and lift it from the substrate support or lift pins. Staggering of the lift pins as will be described below may be used to allow individual engagement and delivery of substrates when multiple substrates are being transferred in some embodiments.

As shown, a first end piece 640 may be coupled with the arm 637 at a distal end from the central hub, and which may be facing back towards the central hub. Additionally, one or more second end pieces 642 may be coupled with the arm 637 and may be facing away from the central hub, or towards the first end piece. The second end pieces 642 may be positioned along the arm a distance from the first end piece 640 greater than a diameter of a substrate to be engaged. As shown in FIG. 6B, a support surface is provided, on which the substrate may be seated. Each of the first end piece 640 and the second end piece 642 may define a recessed ledge including a shelf portion extending towards the substrate to be supported. First end piece 640 may define shelf 641 extending towards the associated second end piece 642, and second end piece 642 may define shelf 643 extending towards the associated first end piece 640. Together, the shelves may produce a wafer support surface about two or more exterior or radial edges of substrate 601. Although in some embodiments the first end piece and the second end piece may be different components, or may extend for longer arcuate sections, the first end piece and the second end piece may extend vertically to a similar horizontal plane through the central axis of the central hub to produce a substantially planar surface for substrate support. Additionally, each of the end pieces may be characterized by an arcuate profile as illustrated, which may accommodate an arcuate edge of a substrate in some embodiments.

Figure 6C:
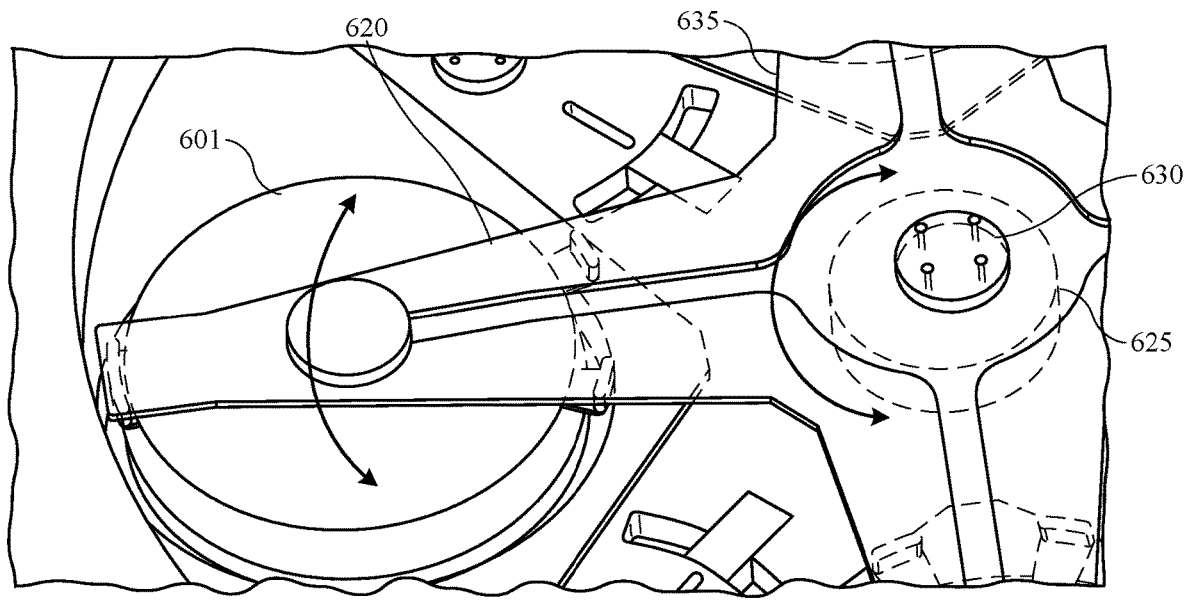

After the transfer is complete to the transfer apparatus 620, the substrates may be rotated between the substrate supports for further processing in different processing regions, or to deliver the substrates to substrate supports accessible by a transfer robot, such as second robotic arm 110 described above. Translation of the substrate or substrates may occur by causing one or more rotations of the first shaft and the second shaft, which may cause rotation of the arms and the housing as illustrated in FIG. 6C.

Transfer apparatus 620 may facilitate both rotational translation of a substrate as well as substantially linear or lateral translation of a substrate by operating rotation of the central hub and eccentric hub in one or more ways. As shown in FIG. 6C, the central hub 625 and eccentric hub 630 may be co-rotated in either direction at a fixed rotation ratio, which may rotate the end effector 635 and any engaged substrate. This may occur by rotating both the second shaft at operation 515 and the first shaft at operation 520 together in a fixed ratio of rotation, or by rotating the second shaft and locking the first shaft with the second shaft, which may also rotate the first shaft in the same direction as the second shaft, and may radially reposition the substrate 601 about a central axis within the transfer region of the chamber at operation 525.

Figure 6D:
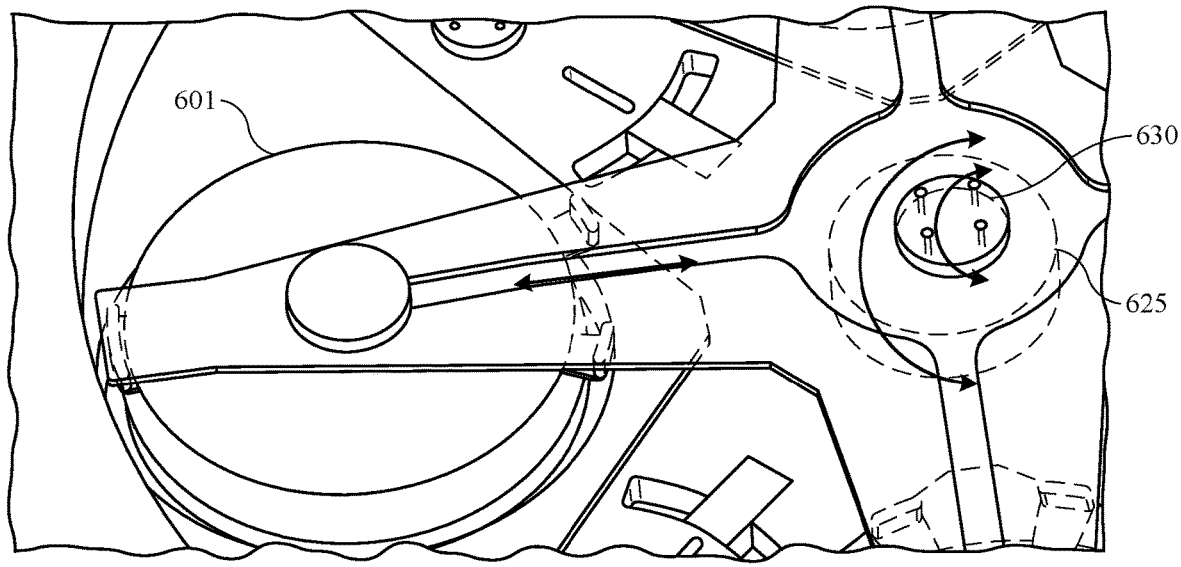

Additionally, operations 515-525 may include lateral adjustments to the substrate to reposition the substrate to improve centering of the substrate on the substrate support. As illustrated in FIG. 6D, when the first shaft with which eccentric hub 630 is coupled is further rotated, such as at a faster speed than the second shaft with which the central hub 625 is coupled, the eccentric hub may be rotated about the central axis of the central hub 625, which may laterally adjust the position of the substrate 601. The eccentric hub may be further rotated in the first direction or counter-rotated relative to the central hub in the second direction opposite a first direction of rotation of the central hub. When the rotation of the eccentric hub, which may be coupled with the end effector, is coordinated with a correctional rotation, such as a minor rotation relative to the rotation of the eccentric hub, a substantially linear translation of the substrate along a radius from the central axis of the central hub may be performed as illustrated. The linear translation, when used in conjunction with the rotational translation, may allow both movement between substrate supports for the multiple substrates, as well as centering of the substrate on the substrate supports. When staggered lift pins are incorporated with the system as described further below, each substrate may be individually centered prior to delivery on the substrate support.

Figure 6E:
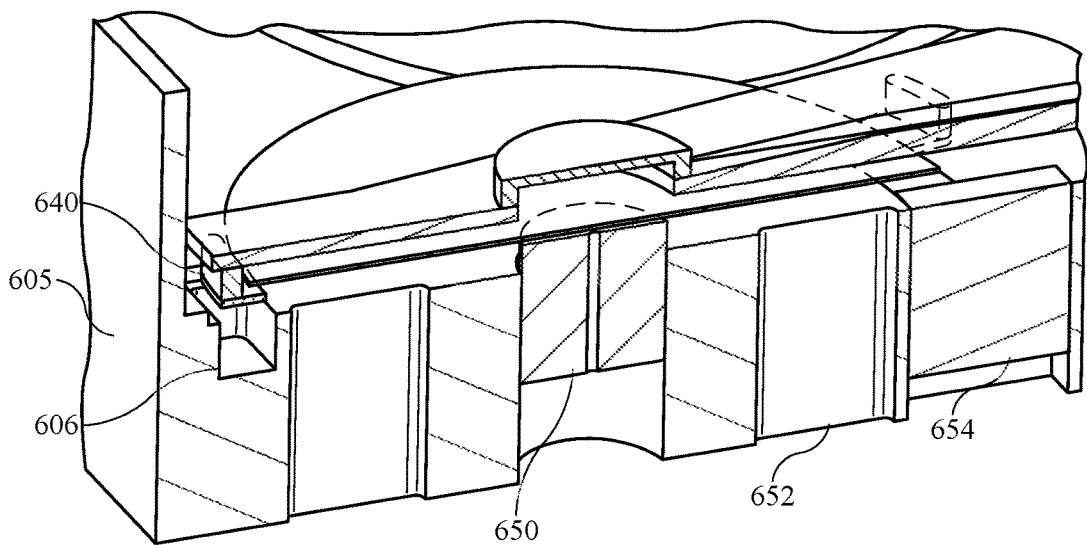

As previously noted, substrate handling systems according to embodiments of the present technology may have monitoring and alignment systems, including an alignment hub 650 positioned between each pair of substrate supports, as illustrated in the cross-sectional view of FIG. 6E, such as illustrated through line A-A in FIG. 6A. Additional access ports 652, 654 may allow a camera or laser to impinge on the substrate to identify misalignment, which could be based on a notch or other identifier on the substrate. As illustrated in the figure, one or more recesses as previously described may be defined in a floor of the housing of the transfer region 605. For example, recess 606 may be defined in the floor, which may accommodate a first end piece 640. Accordingly, transfer apparatus 620 may be recessed over the alignment system and recessed within the transfer chamber housing, while the substrates are being processed, such as in overlying processing regions. In some embodiments, the alignment hub 650 may not fully recess within the transfer region housing, and thus each arm of the transfer apparatus may include an aperture through the arm and a cap or protrusion over the aperture, which may accommodate the alignment hub to limit or prevent contact between the components.

Figure 6F:
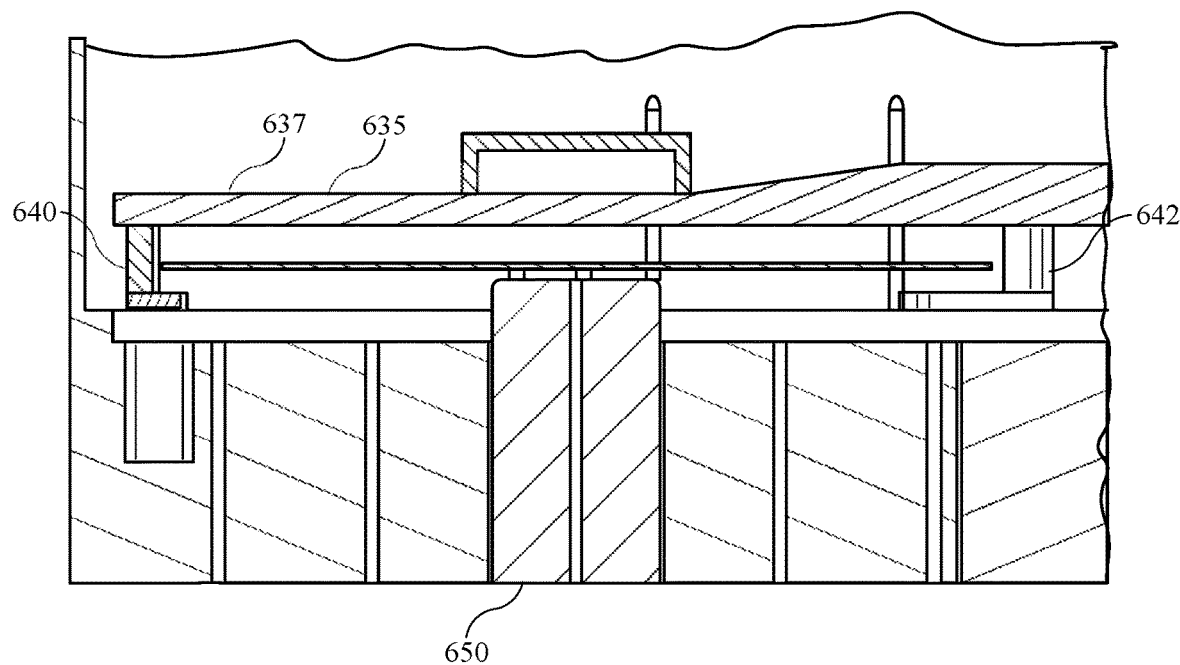

In some embodiments an optional alignment operation may be performed on each of the substrates at optional operation 530. As illustrated in FIG. 6F, which may be a cross-sectional view take through line A-A in FIG. 6A, the substrate may be transferred to alignment hub 650, which may be facilitated by a profile of arm 637 or end effector 635 as well as a vertical length of end pieces 640, 642. As illustrated, end pieces 640, 642 may extend a vertical distance from the arm 637, which may allow the substrate to be lifted between the shelf portions and the arm for alignment. Accordingly, the end effector may be maintained in position during an alignment operation. The alignment hub 650 may be raised to transfer the substrate, or the substrate may be lowered to the alignment hub 650 in different embodiments. Regardless, one or more of the aligners, depending on how many substrates are being translated, may receive the substrate, and support the substrate between the end pieces and the arms of the end effector. An alignment adjustment may be performed, and the transfer apparatus may re-engage the substrates.

Additionally, in some embodiments, the end effector may be laterally adjusted to perform a centering operation during the alignment. For example, once transferred to the alignment hub 650, the transfer apparatus may be adjusted to accommodate an offset error. In some embodiments, the alignment hubs may be vertically offset from one another to accommodate singular drop-off and pick-up of the substrates for alignment and centering. Accordingly, in some embodiments the vertical distance between the shelfs of the end effector end pieces and the surface of the arm from which the end pieces extend, may accommodate the staggered height between a highest and lowest alignment hub position during alignment operations or transfers. This may accommodate any number of substrates, which may facilitate centering during pick-up of wafers in some embodiments, although centering may also be performed prior to delivery of each substrate in some embodiments.

After the alignment operation, or otherwise if alignment is not performed, the transfer apparatus may continue to rotate the substrates towards a second substrate support to which the substrate is to be delivered. Once the substrate has been positioned over a second substrate support within the transfer region, the substrate may be delivered to the support or associated lift pins at operation 535 by reversing the engagement process previously performed. Once delivered, the transfer apparatus may disengage the substrate from the transfer apparatus. Again, the substrate may be lowered with the transfer apparatus, and/or the substrate support, or lift pins of the substrate support may engage the substrate to accept the substrate from the transfer apparatus. The end effector may then be rotated away from the substrates, which may then proceed with processing or transfer from the transfer region.

Figure 7A:
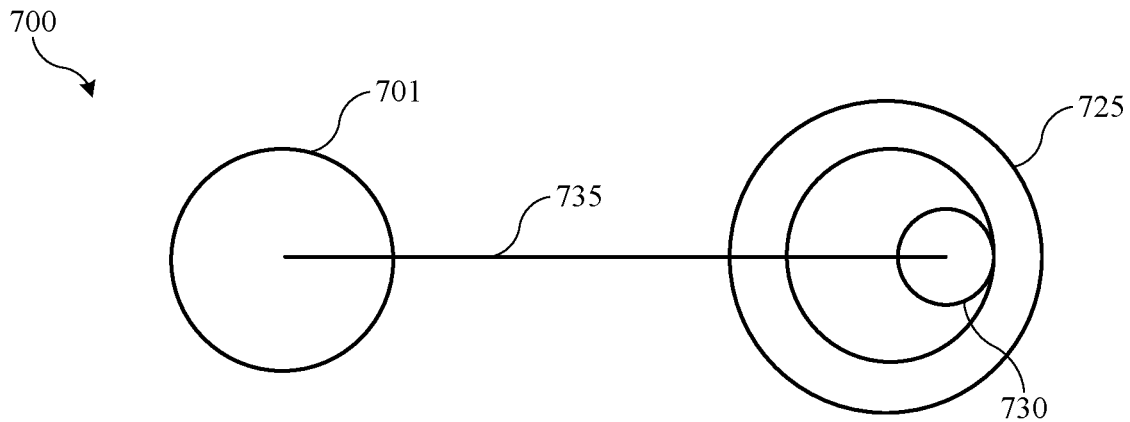
FIGS. 7A-7B show schematic views of substrates being translated according to some embodiments of the present technology.
Figure 7B:
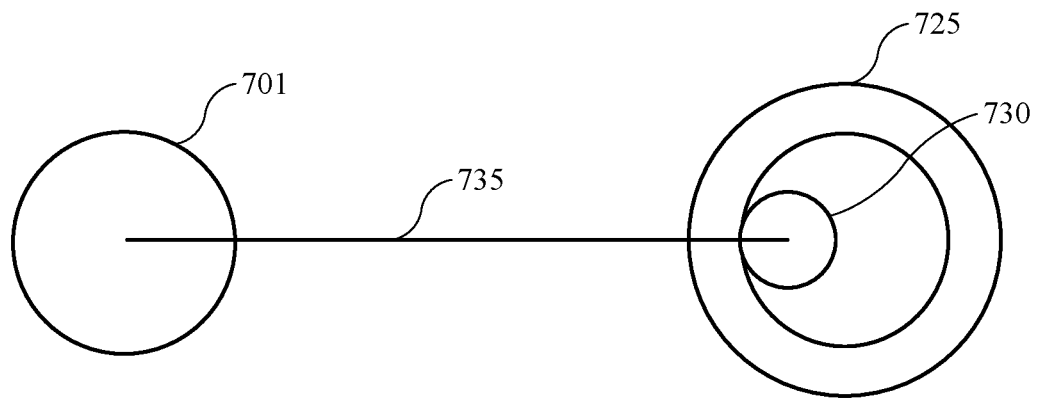

FIGS. 7A-7B show schematic views of substrates being laterally translated with a transfer apparatus 700 according to some embodiments of the present technology. Transfer apparatus 700 is included as a simplified illustration of the operation of one possible embodiment of an eccentric drive system of the present technology, and is not intended to limit the present technology. Transfer apparatus 700 may illustrate any of the transfer apparatuses discussed elsewhere, and may include any of the components as discussed previously. Although transfer apparatus 700 is illustrated with a single substrate, it is to be understood that any number of substrates may be coupled with end effectors as previously described.

As illustrated in FIG. 7A, a substrate 701 may be coupled with an end effector 735, which may be joined with an eccentric hub 730, operable in coordination with a central hub 725. When central hub 725 and eccentric hub 730 are rotated in a fixed ratio of rotation, such as to maintain the location of the eccentric hub 730 relative to the central hub 725 with regard to the substrate 701, the substrate 701 may rotate about a central axis of the central hub 725, such as to be rotated about a transfer region as previously described.

When the eccentric hub 730 is rotated at a faster, or also slower, rotational rate or ratio relative to the central hub 725, eccentric hub 730 may rotate along the eccentric axis about the central axis. FIG. 7B shows a position where eccentric hub has been rotated to an opposite side of the central axis, which may produce a lateral translation of the substrate an amount that is equal to twice the distance of eccentric offset between a central axis of the eccentric hub and the central axis of the central hub. When a correctional amount of rotation by the central hub is performed during transition of the eccentric hub, a rotational location of the substrate 701 may be maintained, and any distance along this eccentric length may be accommodated linearly by reduced movement eccentrically.

Figure 8:
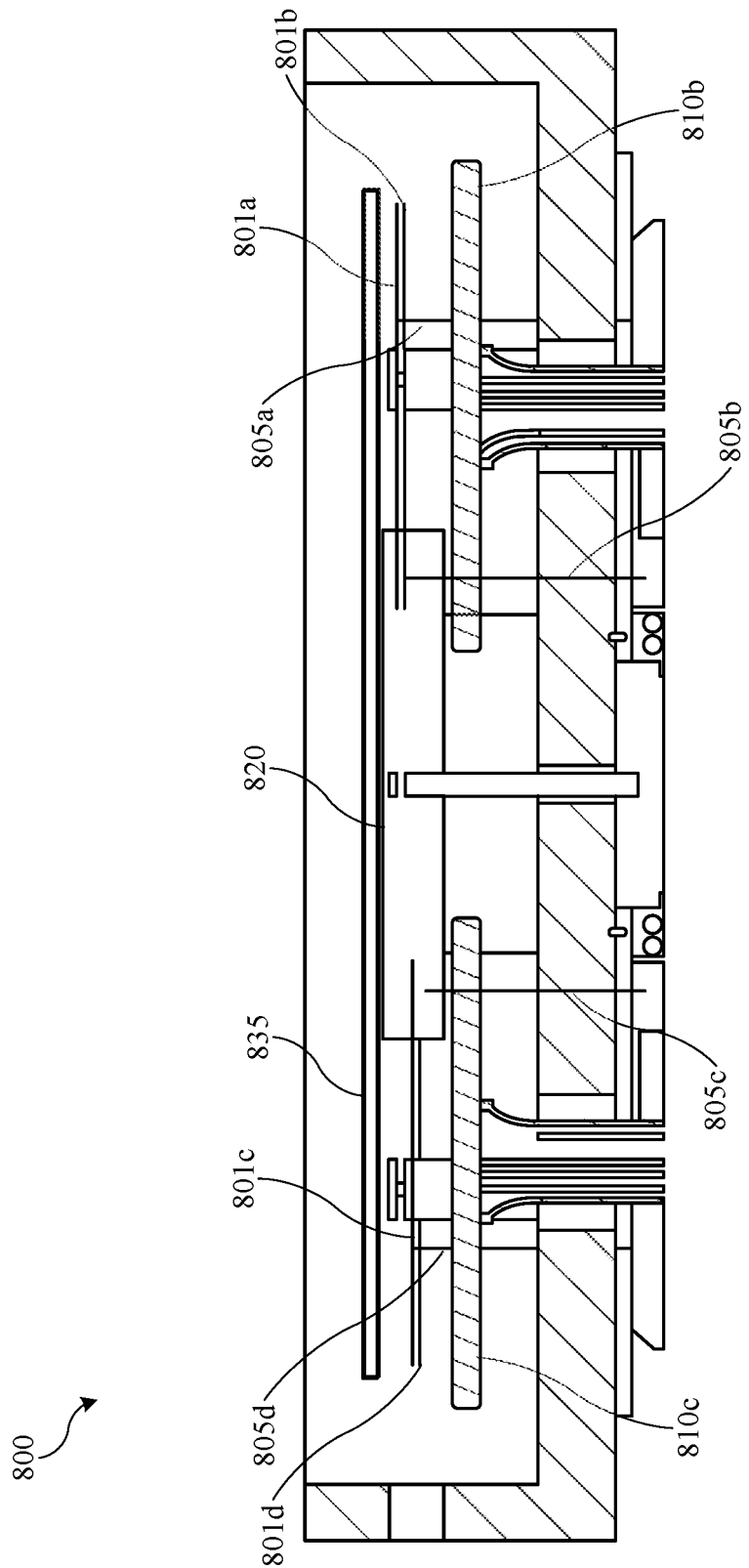
FIG. 8 shows a schematic cross-sectional elevation view of a transfer section of an exemplary substrate processing system according to some embodiments of the present technology.

FIG. 8 shows a schematic cross-sectional elevation view of an exemplary transfer region of a substrate processing system 800 according to some embodiments of the present technology. FIG. 8 illustrates a staggered lift pin configuration as previously described, and as may be included in any of the transfer chambers or substrate handling systems previously described. For example, any of the lift pins described previously may include staggered height lift pins as illustrated. Substrate handling system 800 may include any of the components, configurations, and characteristics of any of the previously described embodiments, and similarly any previously described system may include the lift pin configuration illustrated. System 800 may include a plurality of substrates 801 individually positioned on sets of lift pins 805 within the chamber, which may also include a transfer apparatus 820, which may include features of any of the transfer apparatuses previously described, including arms 835 extending from the transfer apparatus.

Lift pins 805 may be sets of pins that extend from substrate supports 810 to provide accessibility for delivering or retrieving a substrate 801, and each set may include any number of pins to accommodate a substrate. As illustrated, lift pin sets 805 are staggered at four different heights, which may allow individual delivery and retrieval of substrates. For example, lift pins 805a may extend a first vertical length above a substrate support. Lift pins 805b may extend a second vertical length above substrate support 810b illustrated in the cross-section, and which may hide a substrate support from which lift pins 805a may extend, although the substrate supports may be in line. The second vertical length may be less than the first vertical length as shown.

Additionally, lift pins 805c may extend a third vertical length from substrate support 810c, and the third vertical length may be less than the second vertical length. Finally, lift pins 805d may extend a fourth vertical length from an associated substrate support, which may be hidden by and in line with substrate support 810c. The fourth vertical length may be less than the third vertical length. By staggering the heights of the lift pin sets, individual adjustments may be made to each substrate prior to delivery or retrieval of the substrates. For example, when disposed on the associated lift pins, substrate 801a may be accessible above substrate 801b, which may be accessible above substrate 801c, and which may be accessible above substrate 801d.

The present technology includes substrate processing systems that may accommodate additional substrate supports that may not otherwise be accessible to centrally located transfer robots as previously described. By incorporating transfer apparatuses according to embodiments of the present technology, multiple substrate supports may be utilized and accessed during substrate processing. When transfer apparatuses include eccentric drives operating in conjunction with central rotational drives, lateral translation may be provided in addition to rotational translation. Additionally, when end effectors according to some embodiments of the present technology are utilized, the movements to engage, transfer, and disengage with substrates may all be performed along exterior edges of the substrates, which may facilitate avoiding lift pins along an interior of the substrate support.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a substrate" includes a plurality of such substrates, and reference to "the arm" includes reference to one or more arms and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a transfer region housing defining a transfer region fluidly coupled with a plurality of processing regions disposed above the transfer region, wherein a sidewall of the transfer region housing defines a sealable access for providing and receiving substrates;
a plurality of substrate supports disposed within the transfer region; and
a transfer apparatus comprising:
a central hub including a first shaft and a second shaft extending about and concentric with the first shaft, wherein the second shaft is counter-rotatable with the first shaft, and wherein the central hub is characterized by a central axis, wherein each of the plurality of substrate supports is at a fixed horizontal position relative to the central hub;
a flexible drive coupled with the first shaft, the flexible drive being configured to enable the first shaft to bend outward from the central axis; and
an end effector coupled with the first shaft, the end effector comprising a body having a plurality of arms equal to a total number of substrate supports of the plurality of substrate supports.

2. The substrate processing system of claim 1, wherein the plurality of substrate supports comprises at least four substrate supports, and wherein each processing region of the plurality of processing regions is vertically offset from the transfer region.

3. The substrate processing system of claim 1, wherein the flexible drive is coupled with the first shaft proximate an end of the first shaft opposing the end effector.

4. The substrate processing system of claim 1, wherein the flexible drive is bendable in any direction from the central axis.

5. The substrate processing system of claim 1, wherein the end effector further comprises a plurality of end pieces configured to support a substrate.

6. The substrate processing system of claim 5, wherein each end piece extends vertically to a similar plane extending orthogonally to the central hub.

7. The substrate processing system of claim 5, wherein each arm includes a first end piece and a second end piece of the plurality of end pieces, the first end piece and the second end piece configured to support a substrate during movement of the end effector.

8. The substrate processing system of claim 5, wherein each first end piece and each second end piece define a recessed ledge and a shelf.

9. The substrate processing system of claim 1, wherein each of the plurality of arms compensates for any tilting of the first shaft to maintain a substrate substantially parallel with a respective one of the plurality of substate supports.

10. A method of transferring a substrate, the method comprising:
receiving a substrate at a first substrate support within a transfer region of a substrate processing system, wherein the transfer region is fluidly coupled with a plurality of processing regions disposed above the transfer region, and wherein the substrate processing system includes a transfer apparatus positioned within the transfer region and comprising:
a central hub including a first shaft and a second shaft extending about and concentric with the first shaft;
a flexible drive coupled with the first shaft, the flexible drive being configured to enable the first shaft to bend outward from a central axis of the central hub; and
an end effector coupled with the first shaft, the end effector comprising a plurality of arms;
engaging the substrate with an arm of the plurality of arms; and
bending the first shaft outward from the central axis of the central hub to linearly translate the substrate within the transfer region.

11. The method of transferring a substrate of claim 10, further comprising providing, using the arm, one or both of a compensating force and a tilt opposite a tilt direction produced by the flexible drive to maintain the substrate substantially parallel with the first substrate support.

12. The method of transferring a substrate of claim 11, wherein the one or both of the compensating force and the tilt compensate for at least 90% of tilt induced by movement of the flexible drive.

13. The method of transferring a substrate of claim 10, further comprising, subsequent engaging the substrate, lifting the substrate from the first substrate support by translating the transfer apparatus vertically within the transfer region of the substrate processing system.

14. The method of transferring a substrate of claim 10, wherein each arm of the end effector comprises a first end piece and a second end piece, and wherein each first end piece and each second end piece define a recessed ledge and a shelf.

15. The method of transferring a substrate of claim 10, further comprising delivering the substrate to a second substrate support within the transfer region of the substrate processing system, wherein each of the first substrate support and the second substrate support is at a fixed horizontal position relative to the central hub.

16. The method of transferring a substrate of claim 15, further comprising, prior to delivering the substrate to the second substrate support, delivering the substrate to an alignment hub positioned between the first substrate support and the second substrate support.

17. The method of transferring a substrate of claim 10, wherein the substrate processing system includes at least four substrates, and wherein engaging the substrate comprises individually or simultaneously engaging the at least four substrates with the end effector.

18. A transfer apparatus, comprising:
a central hub including a first shaft and a second shaft extending about and concentric with the first shaft, wherein the second shaft is counter-rotatable with the first shaft, and wherein the central hub is characterized by a central axis;
a flexible drive coupled with the first shaft, the flexible drive being configured to enable the first shaft to bend outward from the central axis; and
an end effector coupled with the first shaft, the end effector comprising a body having a plurality of arms.

19. The transfer apparatus of claim 18, wherein the flexible drive is coupled with the first shaft proximate an end of the first shaft opposing the end effector.

20. The transfer apparatus of claim 18, wherein each of the plurality of arms compensates for any tilting of the first shaft to maintain a substrate substantially parallel with a respective one of the plurality of substate supports.

* * * * *